(12) United States Patent
Mu

(10) Patent No.: US 11,366,557 B2
(45) Date of Patent: Jun. 21, 2022

(54) ARRAY SUBSTRATE AND MANUFACTURING METHOD THEREFOR, DRIVING METHOD, AND TOUCH DISPLAY APPARATUS

(71) Applicants: Hefei Xinsheng Optoelectronics Technology Co., Ltd., Anhui (CN); BOE Technology Group Co., Ltd., Beijing (CN)

(72) Inventor: Suzhen Mu, Beijing (CN)

(73) Assignees: Hefei Xinsheng Optoelectronics Technology Co., LTD, Anhui (CN); BOE Technology Group Co., LTD., Beijing (CN)

( * ) Notice: Subject to any disclaimer, the term of this patent is extended or adjusted under 35 U.S.C. 154(b) by 0 days.

(21) Appl. No.: 17/254,319

(22) PCT Filed: Jan. 20, 2020

(86) PCT No.: PCT/CN2020/073108
§ 371 (c)(1),
(2) Date: Dec. 21, 2020

(87) PCT Pub. No.: WO2020/156300
PCT Pub. Date: Aug. 6, 2020

(65) Prior Publication Data
US 2021/0117045 A1    Apr. 22, 2021

(30) Foreign Application Priority Data
Jan. 31, 2019    (CN) .......................... 201910095797.0

(51) Int. Cl.
*G06F 3/044*    (2006.01)
*H01L 27/32*    (2006.01)
*G06F 3/041*    (2006.01)

(52) U.S. Cl.
CPC .......... *G06F 3/0445* (2019.05); *G06F 3/0412* (2013.01); *H01L 27/323* (2013.01);
(Continued)

(58) Field of Classification Search
CPC ...... G06F 3/0445; G06F 3/0412; G06F 3/044; H01L 27/323; H01L 27/3276
See application file for complete search history.

(56) References Cited

U.S. PATENT DOCUMENTS 10,310,649 B2 *    6/2019   Zhang ................. G02F 1/13338
10,496,202 B2 *   12/2019   Zhan ..................... G06F 3/0446
(Continued)

FOREIGN PATENT DOCUMENTS

CN    103197796 A    7/2013
CN    105824482 A    8/2016
(Continued)

OTHER PUBLICATIONS

International search report of PCT application No. PCT/CN2020/073108 dated Apr. 23, 2020.
(Continued)

*Primary Examiner* — Sardis F Azongha
(74) *Attorney, Agent, or Firm* — Fay Sharpe LLP

(57) ABSTRACT

An array substrate, including: a plurality of data lines, a plurality of touch lines, a plurality of touch electrodes, and a plurality of first switching devices. Each of the touch electrodes is electrically connected to at least one of the touch lines, each of the first switching devices is electrically connected to one of the data lines and one of the touch electrodes respectively, and each of the first switching devices is configured to selectively turn on or turn off the data line and the touch electrode which are connected.

21 Claims, 13 Drawing Sheets

(52) U.S. Cl.
CPC .............. *H01L 27/3276* (2013.01); *G06F 2203/04103* (2013.01); *H01L 2227/323* (2013.01)

(56) References Cited

U.S. PATENT DOCUMENTS

| | | |
|---|---|---|
| 2015/0049050 A1 | 2/2015 | Zhao |
| 2017/0153747 A1 | 6/2017 | Yoon et al. |
| 2018/0210587 A1 | 7/2018 | Zhang et al. |
| 2019/0235294 A1 | 8/2019 | Wang et al. |
| 2020/0176477 A1* | 6/2020 | Liu .................. H01L 29/78633 |

FOREIGN PATENT DOCUMENTS

| | | |
|---|---|---|
| CN | 106095184 A | 11/2016 |
| CN | 106445251 A | 2/2017 |
| CN | 206039484 U | 3/2017 |
| CN | 206178745 U | 5/2017 |
| CN | 107193419 A | 9/2017 |
| CN | 108227326 A | 6/2018 |
| CN | 109166457 A | 1/2019 |
| CN | 109828697 A | 5/2019 |

OTHER PUBLICATIONS

First office action of Chinese application No. 201910095797.0 dated Feb. 6, 2020.
Second office action of Chinese application No. 201910095797.0 dated Nov. 5, 2020.

\* cited by examiner

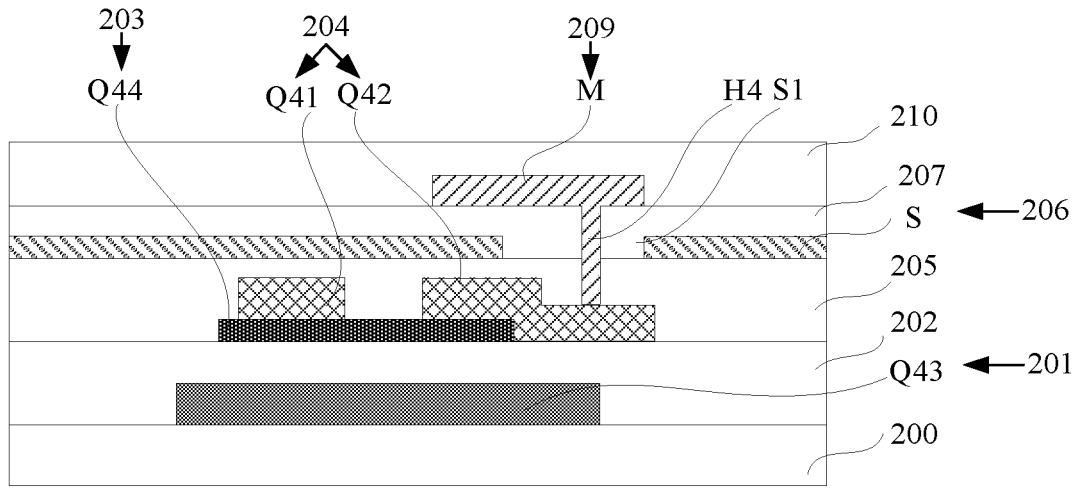

FIG. 14

| At a display stage, a first switching device is controlled to turn off an electrical connection between a corresponding data line and a touch electrode, and a data signal is provided by the data line | 1501 |

| At a touch stage, the first switching device is controlled to turn on an electrical connection between the corresponding data line and the touch electrode, and a touch signal is provided for the touch electrode by both the data line and the touch line | 1502 |

FIG. 15

ARRAY SUBSTRATE AND MANUFACTURING METHOD THEREFOR, DRIVING METHOD, AND TOUCH DISPLAY APPARATUS

This application is a 371 of PCT Application No. PCT/CN2020/073108, filed on Jan. 20, 2020, which claims priority to Chinese Patent Application No. 201910095797.0, filed on Jan. 31, 2019, and titled "ARRAY SUBSTRATE, METHOD FOR MANUFACTURING SAME, TOUCH DISPLAY APPARATUS, AND METHOD FOR DRIVING SAME", the entire contents of which are incorporated herein by reference.

TECHNICAL FIELD

The present disclosure relates to the field of display technologies, and in particular, to an array substrate, a method for manufacturing the same, a method for driving the same, and a touch display apparatus.

BACKGROUND

At present, to achieve thinner and lighter touch panels, researches on integrating touch panels and liquid crystal display panels are increasingly popular. Among the researches, an in-cell touch solution for embedding a touch panel into a liquid crystal display panel has attracted widespread attention.

SUMMARY

In one aspect, an embodiment of the present disclosure provides an array substrate, including a plurality of data lines, a plurality of touch lines, a plurality of touch electrodes, and a plurality of first switching devices. Each of the touch electrodes is electrically connected to at least one of the touch lines, each of the first switching devices is electrically connected to one of the data lines and one of the touch electrodes respectively, and each of the first switching devices is configured to selectively turn on or turn off the data line and the touch electrode which are connected.

In another aspect, an embodiment of the present disclosure further provides an array substrate, including a base substrate, and a first conductive pattern layer, a gate insulating layer, a first semiconductor pattern layer, a second conductive pattern layer, a first insulating layer, a touch electrode layer, a second insulating layer, a third conductive pattern layer, a third insulating layer, and a first electrode layer that are sequentially disposed on the base substrate along a direction distal from the base substrate;

the first conductive pattern layer includes a plurality of gate lines, a plurality of first control lines, control electrodes of a plurality of first thin film transistors, and control electrodes of a plurality of switching thin film transistors, the plurality of first control lines have a same extension direction as the plurality of gate lines, the control electrodes of the plurality of first thin film transistor is electrically connected to the first control line, and the control electrodes of the plurality of switching thin film transistors are electrically connected to the gate lines;

the first semiconductor pattern layer includes active layers of the plurality of first thin film transistors and active layers of the plurality of switching thin film transistors;

the second conductive pattern layer includes a plurality of data lines, first electrodes and second electrodes of the plurality of first thin film transistors, and first electrodes and second electrodes of the plurality of switching thin film transistors, and the first electrode of the first thin film transistor and the first electrode of the switching thin film transistor are electrically connected to the corresponding data line respectively;

the touch electrode layer includes a plurality of touch electrodes disposed in an array, and each of the touch electrodes is electrically connected to the second electrode of at least one of the first thin film transistors;

the third conductive pattern layer includes a plurality of touch lines, the plurality of touch lines have a same extension direction as the data line, and each of the touch electrodes is electrically connected to at least one of touch lines;

the first electrode layer includes a plurality of first electrodes, and the first electrode is at least one of following electrodes: a pixel electrode and an electrode of an organic light-emitting diode; and the plurality of gate lines intersect with the plurality of data lines and define a plurality of subpixel regions, one of the switching thin film transistors and one of the first electrodes are provided in each of the subpixel regions, and the second electrode of each of the switching thin film transistors is electrically connected to the corresponding first electrode.

In another aspect, an embodiment of the present disclosure further provides a touch display apparatus, wherein the touch display apparatus includes the foregoing array substrate.

In another aspect, an embodiment of the present disclosure further provides a method for driving an array substrate, wherein the driving method includes:

at a display stage, controlling a first switching device to turn off an electrical connection between a data line and a touch electrode, and providing a data signal by the data line; and at a touch stage, controlling the switching device to turn on an electrical connection between the data line and the touch electrode, and providing a touch signal for the touch electrode by both the data line and the touch line.

In another aspect, an embodiment of the present disclosure further provides a method for manufacturing an array substrate, including: providing a base substrate; and forming a plurality of data lines, a plurality of touch lines, a plurality of touch electrodes, and a plurality of first switching devices on the base substrate. Each of the touch electrodes is electrically connected to at least one of the touch lines, each of the first switching devices is electrically connected to one of the data lines and one of the touch electrodes separately, and each of the first switching devices is configured to selectively turn on or turn off the data line and the touch electrode which are connected.

BRIEF DESCRIPTION OF THE DRAWINGS

To more clearly describe the technical solutions of the embodiments of the present disclosure, the accompanying drawings required to describe the embodiments are briefly described below. Apparently, the accompanying drawings described below are only some embodiments of the present disclosure. Those of ordinary skill in the art may further obtain other accompanying drawings based on these accompanying drawings without inventive efforts.

FIG. 14 is a schematic diagram of a section structure of an array substrate at a third thin film transistor according to an embodiment of the present disclosure;

FIG. 15 is a flowchart of a method for driving a touch display apparatus according to an embodiment of the present disclosure;

DETAILED DESCRIPTION

To make the purpose, technical solutions, and advantages of the present disclosure clearer, the implementations of the present disclosure are described below in detail with reference to the accompanying drawings.

An in-cell touch solution mainly includes two manners: self-capacitance touch and mutual-capacitance touch. In the self-capacitance touch manner, a touch display panel usually multiplexes a common electrode and a touch electrode. Such a touch display panel includes a plurality of touch electrodes distributed in an array, and each touch electrode is connected to one touch line. At a display stage, the touch line provides a common voltage signal to the touch electrode, and in this case, the touch electrode is a common electrode. At a touch stage, the touch line provides a touch signal to the touch electrode, and feeds back a detection signal to a touch chip.

Usually, a width of the touch line needs to be relatively large to reduce resistance of the touch line, thereby avoiding an IR drop phenomena, in other words, a phenomenon that a near-end voltage is greater than a far-end voltage. In this case, a width of a black array needs to be increased to block the touch line. Consequently, a low aperture ratio of products is caused.

Figure 1:
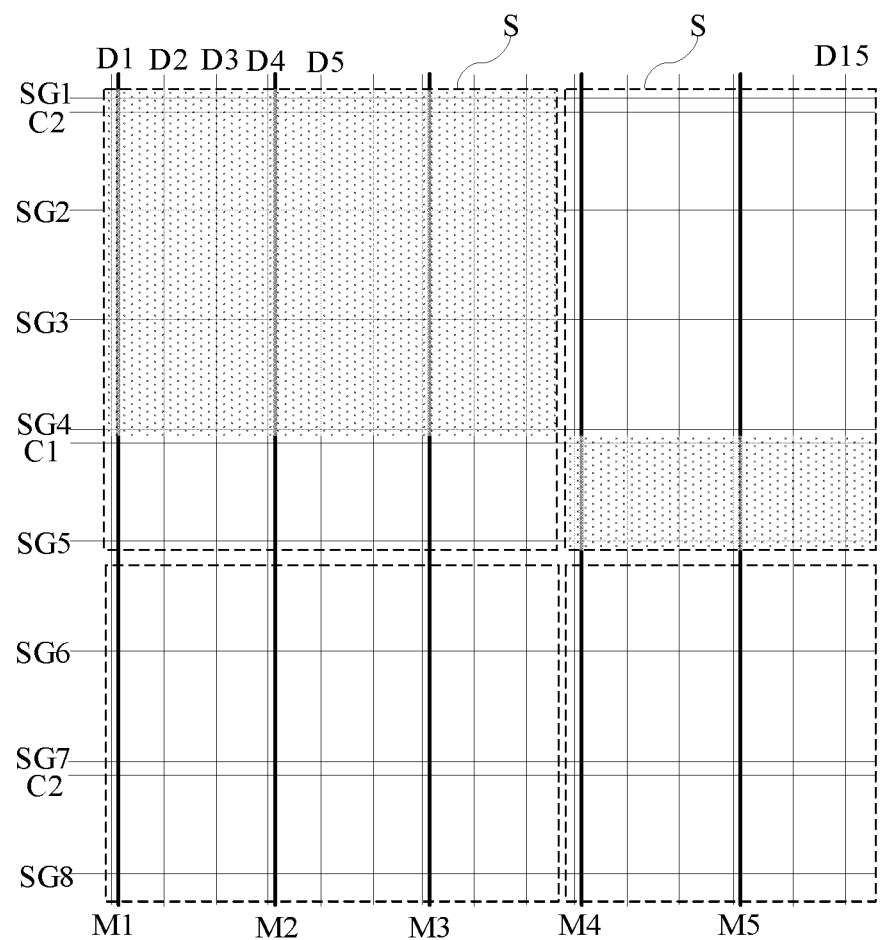
FIG. 1 is a schematic diagram of a partial structure of an array substrate according to an embodiment of the present disclosure.

FIG. 1 is a schematic diagram of a partial structure of an array substrate according to an embodiment of the present disclosure. Referring to FIG. 1, the array substrate includes a plurality of data lines D (such as D1 to D15 in FIG. 1), a plurality of touch lines M (such as M1 to M5 in FIG. 1), and a plurality of touch electrodes S (each dashed-line box indicates one touch electrode S). Each touch electrode S is electrically connected to at least one touch line M, and each touch electrodes S is connected to different touch lines M. The array substrate further includes a plurality of first switching devices (not shown in FIG. 1). Each of the first switching devices is electrically connected to one of the data lines D and one of the touch electrodes S separately, and each of the first switching devices is configured to selectively turn on or turn off the data line D and the touch electrode S.

In this embodiment of the present disclosure, that a first part is electrically connected to a second part means that an electrical signal can be transferred between the first part and the second part. For example, that the touch electrode S is electrically connected to the touch line M means that an electrical signal can be transferred between the touch electrode S and the touch line M. Electrical connection manners include, but are not limited to, a direct connection, a connection through a via, a connection by other conductive component, and the like.

Selectively turning on or turning off the data line D and the touch electrode S means turning on or turning off an electrical connection between the data line D and the touch electrode S under control of a control signal. Correspondingly, the array substrate may further include a plurality of first control lines C1, each of the first switching devices is connected to one of the first control lines C1, and one of the first control lines C1 may be connected to a plurality of first switching devices. The first control line C1 is configured to provide a control signal for the connected first switching device.

The first switching device selectively turn on or turn off the data line and the touch electrode. Therefore, at a touch stage, the first switching device may be controlled to electrically connect the data line and the touch electrode, a touch signal is provided to the touch electrode by the data line, and the touch line is electrically connected to the touch electrode. In this case, the touch line may also provide a touch signal for the touch electrode, so that the data line is parallelly connected to the touch line, and resistance of the touch line can be reduced without widening the touch line. Therefore, the resistance of the touch line can be reduced without sacrificing an aperture ratio of products, which is beneficial to increase the aperture ratio of products. However, at a display stage, the first switching device is controlled to turn off an electrical connection between the data line and the touch electrode, and a common voltage signal is provided to the touch electrode by the touch line. In this case, the touch electrode can be multiplexed as a common electrode. In addition, a data voltage is provided for each subpixel by the data line, thereby implementing a normal display function. In addition, in this embodiment of the present disclosure, the touch electrode is integrated on the array substrate, thereby facilitating lightening and thinning of a touch display apparatus.

Multiplexing the touch electrode and the data line at the display stage and the touch stage may integrate a touch chip and a display chip into a single chip, thereby implementing touch and display driver integration (TDDI).

In this embodiment of the present disclosure, the array substrate uses a single-layer self-capacitance touch structure. For example, as shown in FIG. 1, the plurality of touch electrodes S are disposed in an array. It should be noted that a number of the touch electrodes in FIG. 1 is merely an example, and the number of touch electrodes on the array substrate may be set based on an actual requirement.

Optionally, the touch line M and the touch electrode S may be disposed at a same layer or different layers. In this embodiment of the present disclosure, being at the same layer may mean being on a same side of the same layer, or being formed by a same patterning process, or that a surface proximal to a base substrate is in contact with a same layer, or the like. Correspondingly, being at different layers may mean being on different sides of the same layer, or being formed by different patterning processes, or that a surface proximal to the base substrate is in contact with the different layers, or the like.

Optionally, the touch line M may be connected to the touch electrode S directly or through a via or by a second switching device. The second switching device may be a thin film transistor, a first electrode of the thin film transistor is connected to the touch line, a second electrode is connected to the touch electrode, and a control electrode is connected to a second control line C2. The second control line C2 is configured to provide a control signal for the connected thin film transistor.

Optionally, each touch electrode S is electrically connected to at least one data line by the first switching device, and a quantity of data lines D electrically connected to each touch electrode S is equal, to ensure an equal voltage applied to each touch electrode. For example, each touch electrode S is connected to one data line D, or each touch electrode S is connected to two data lines D.

For example, projections of the data line D and the touch electrode S that are electrically connected on the base substrate partially overlap so as to facilitate wiring.

For example, the array substrate may further include a plurality of gate lines SG (such as SG1 to SG8 in FIG. 1) and a plurality of switching thin film transistors (not shown in FIG. 1). The plurality of data lines D intersect with the plurality of gate lines SG and define a plurality of subpixel regions. One switching thin film transistor is provided in each of the subpixel regions, the switching thin film transistor is disposed at an intersection of the gate line SG and the data line D, and each switching thin film transistor is configured to control the corresponding subpixel region to emit light. For example, a control electrode of the switching thin film transistor is connected to the corresponding gate line, a first electrode of the switching thin film transistor is connected to the corresponding data line, and a second electrode of the switching thin film transistor is connected to a corresponding first electrode. The control electrode of the switching thin film transistor may be a gate, the first electrode may be one of a source and a drain, and the second electrode may be the other one of the source and the drain.

For an array substrate of a liquid crystal display apparatus, the first electrode is a pixel electrode. For an array substrate of an organic light-emitting diode display apparatus, the first electrode is an electrode of an organic light-emitting diode, such as a cathode or an anode.

As shown in FIG. 1, in this embodiment of the present disclosure, the first control line C1 may have a same extension direction as the gate line SG, and the touch line M has a same extension direction as the data line D. A display resolution is usually greater than a touch resolution. Therefore, a quantity of data lines D is greater than a quantity of touch lines M, and in this embodiment of the present disclosure, only some data lines D are connected to the first switching device SW1. In this embodiment of the present disclosure, the data line connected to the first switching device may be referred to as a first data line, and a data line other than the first data line (in other words, a data line that is not connected to the first switching device) may be referred to as a second data line. The first switching device may be disposed at an intersection of the first control line and the first data line.

Optionally, in this embodiment of the present disclosure, the first switching device may electrically connect the data line and the touch electrode in two manners. One manner is a direct connection, in other words, the first switching device is connected to the data line and the touch electrode respectively, and a reference made be made to embodiments shown in FIG. 2 to FIG. 8. The other manner is an indirect connection, in other words, the first switching device connects the touch line with a corresponding data line, and thus the data line is electrically connected with the touch electrode by the first switching device and the touch line, and a reference made be made to an embodiment shown in FIG. 14.

A structure of the array substrate provided in this embodiment of the present disclosure is described below in detail by a liquid crystal display apparatus as an example.

Figure 2:
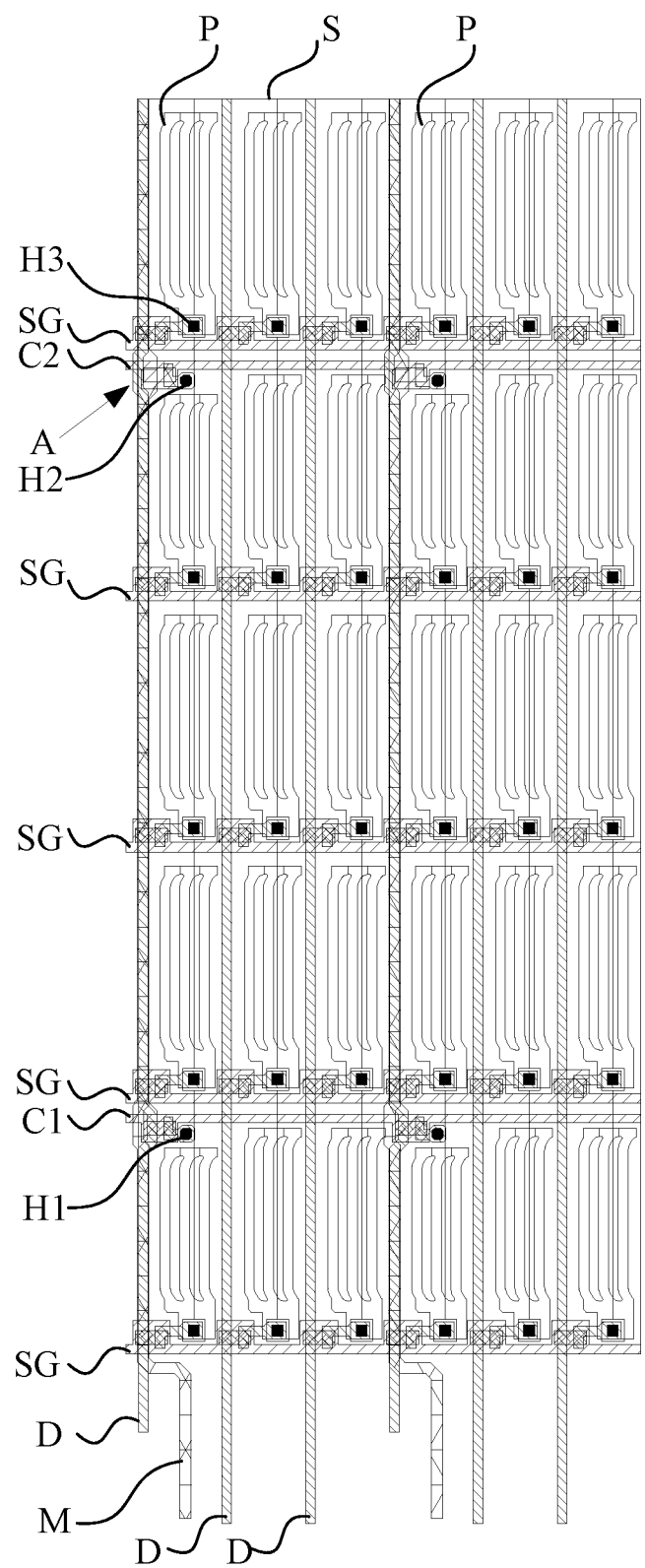
FIG. 2 is a schematic top view of a partial structure of an array substrate according to an embodiment of the present disclosure.

FIG. 2 is a schematic top view of a partial structure of an array substrate according to an embodiment of the present disclosure. As shown in FIG. 2, the array substrate includes a plurality of data lines D, a plurality of touch lines M, a plurality of touch electrodes S (only one is shown in the figure), and a plurality of first switching devices SW1 (referring to FIG. 3). Each of the touch electrodes S is connected to at least one of the touch lines M, and each of the touch electrodes S is connected to different touch lines M. In the embodiment shown in FIG. 2, each of the first switching devices SW1 is correspondingly connected to one of the data lines D and one of the touch electrodes S, in other words, the first switching device SW1 is directly connected to the data line D and the touch electrode.

Figure 3:
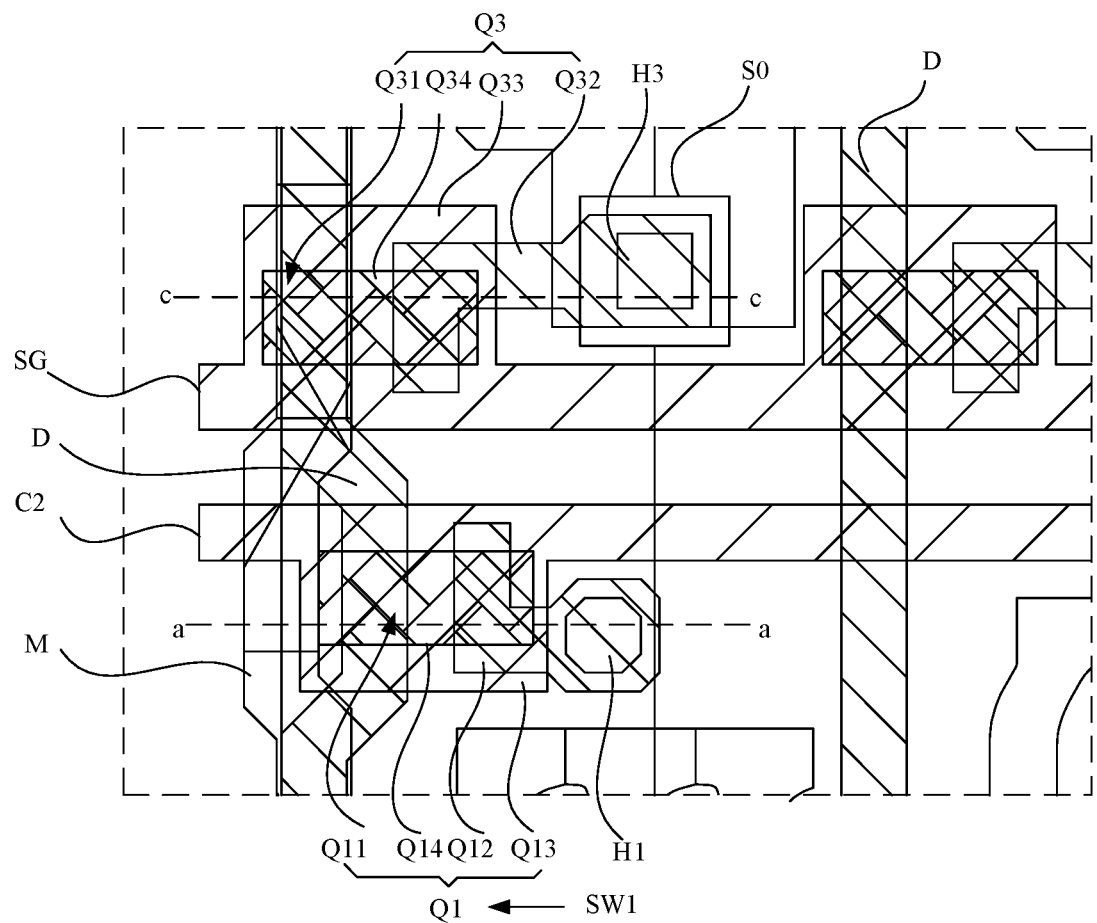
FIG. 3 is a partially enlarged schematic view of the array substrate shown in FIG. 2.

FIG. 3 is a partially enlarged schematic view of the array substrate shown in FIG. 2. As shown in FIG. 3, the first switching device SW1 includes a first thin film transistor Q1, a first electrode Q11 of the first thin film transistor Q1 is electrically connected to the corresponding data line D, and a second electrode Q12 of the first thin film transistor Q1 is connected to one touch electrode S. A control electrode Q13 of the first thin film transistor Q1 is electrically connected to a first control line C1. The first control line C1 is configured to provide a control signal to control the first thin film transistor Q1 to be turned on or turned off, and thus to control an electrical connection between the data line D and the touch electrode S to be turned on or turned off.

The first electrode Q11 of the first thin film transistor Q1 may be one of a source and a drain, the second electrode Q12 of the first thin film transistor Q1 is the other one of the source and the drain, and the control electrode Q13 of the first thin film transistor Q1 is a gate.

For example, the first electrode Q11 of the first thin film transistor Q1 may be electrically connected to the corresponding data line D in one of the following two manners: the first electrode Q11 of the first thin film transistor Q1 is connected to the corresponding data line D, or the first electrode Q11 of the first thin film transistor Q1 is a part of the corresponding data line D. An electrical connection between other electrode and a corresponding line (such as a control line) is the same as this case, and is not described below again.

At the display stage, the first thin film transistor Q1 is turned off, a data signal is provided by the data line D, and a common voltage signal is provided to the touch electrode S by the touch line M. At the touch stage, the first thin film transistor Q1 is turned on, and a touch signal is provided to the touch electrode S by both the data line D and the touch line M, to implement time division multiplexing on the data line.

Figure 4:
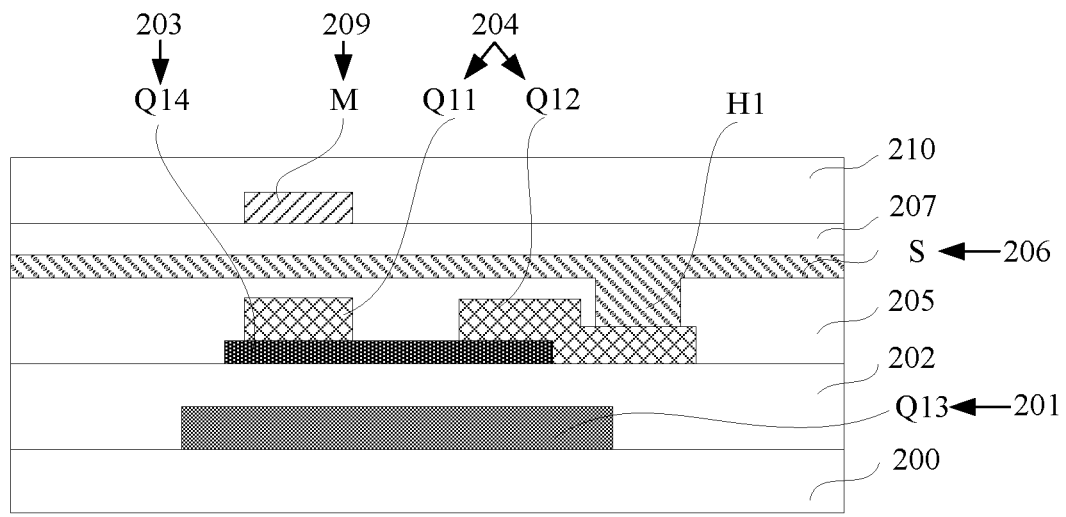
FIG. 4 is a schematic diagram of a section structure of an array substrate along a line a-a in FIG. 3 according to an embodiment of the present disclosure.

For example, FIG. 4 is a schematic diagram of a section structure of an array substrate along a line a-a in FIG. 3 according to an embodiment of the present disclosure, and is used to show a section structure at the first switching device (in other words, at the first thin film transistor Q1). As shown in FIG. 4, in a direction distal from a base substrate 200, the first thin film transistor Q1, the touch electrode S, and the touch line M are sequentially disposed, and the second electrode Q12 of the first thin film transistor Q1 is connected to one touch electrode S.

For example, as shown in FIG. 4, in this embodiment of the present disclosure, the array substrate includes the base substrate 200, and a first conductive pattern layer 201, a gate insulating layer 202, a first semiconductor pattern layer 203, a second conductive pattern layer 204, a first insulating layer 205, a touch electrode layer 206, a second insulating layer 207, a second semiconductor pattern layer 208 (referring to FIG. 6), a third conductive pattern layer 209, a third insulating layer 210, and a first electrode layer 211 (referring to FIG. 8) that are sequentially disposed in a direction distal from the base substrate 200. A control electrode Q13 of the first thin film transistor Q1 is disposed at the first conductive pattern layer 201. An active layer Q14 of the first thin film transistor Q1 is disposed at the first semiconductor pattern layer 203. The first electrode Q11 and the second electrode Q12 of the first thin film transistor Q1 are disposed at the second conductive pattern layer 204. The touch electrode S is disposed at the touch electrode layer 206

With reference to FIG. 3 and FIG. 4, the second electrode Q12 of the first thin film transistor Q1 is connected to one touch electrode S through a first via H1. The first via H1 is disposed in the first insulating layer 205.

Optionally, when the touch line and the touch electrode are disposed at different layers, the touch line may be indirectly connected to the touch electrode by a second switching device (such as a thin film transistor), each of the touch electrodes is electrically connected to the corresponding touch line by one second switching device, and the second switching device is configured to selectively turn on or turn off the touch line and the touch electrode. For example, in the embodiment shown in FIG. 2, the touch line is indirectly connected to the touch electrode by the second switching device SW2 (referring to FIG. 5, such as a second thin film transistor Q2), and the second thin film transistor Q2 is configured to selectively turn on or turn off an electrical connection between the touch electrode S and the touch line M.

Figure 5:
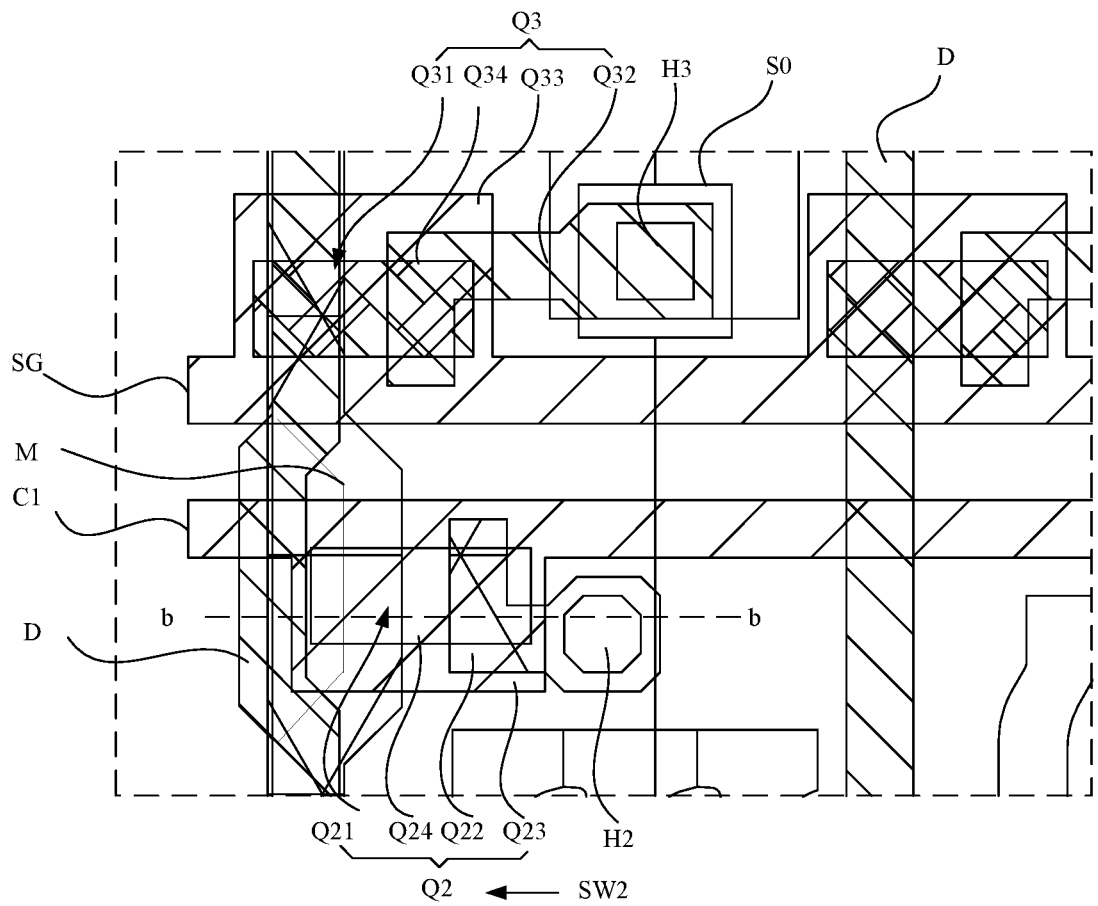
FIG. 5 is another partially enlarged schematic view of the array substrate shown in FIG. 2.

FIG. 5 is a partially enlarged schematic view of the array substrate shown in FIG. 2. As shown in FIG. 5, a first electrode Q21 of the second thin film transistor Q2 is electrically connected to one of the touch lines M, and a second electrode Q22 of the second thin film transistor Q2 is electrically connected to the corresponding touch electrode S. A control electrode Q23 of the second thin film transistor Q2 is electrically connected to a second control line C2. The second control line C2 is configured to provide a control signal to control the second thin film transistor Q2 to be turned on or turned off, and thus to control the touch line M and the touch electrode S to be turned on or turned off.

The first electrode Q21 of the second thin film transistor Q2 may be one of a source and a drain, the second electrode Q22 of the second thin film transistor Q2 is the other one of the source and the drain, and the control electrode Q23 of the second thin film transistor Q2 is a gate.

At both the display stage and the touch stage, the second thin film transistor Q2 is turned on so as to provide a common voltage signal to the touch electrode by the touch line at the display stage, and to provide a touch signal to the touch electrode by the touch line at the touch stage.

Figure 6:
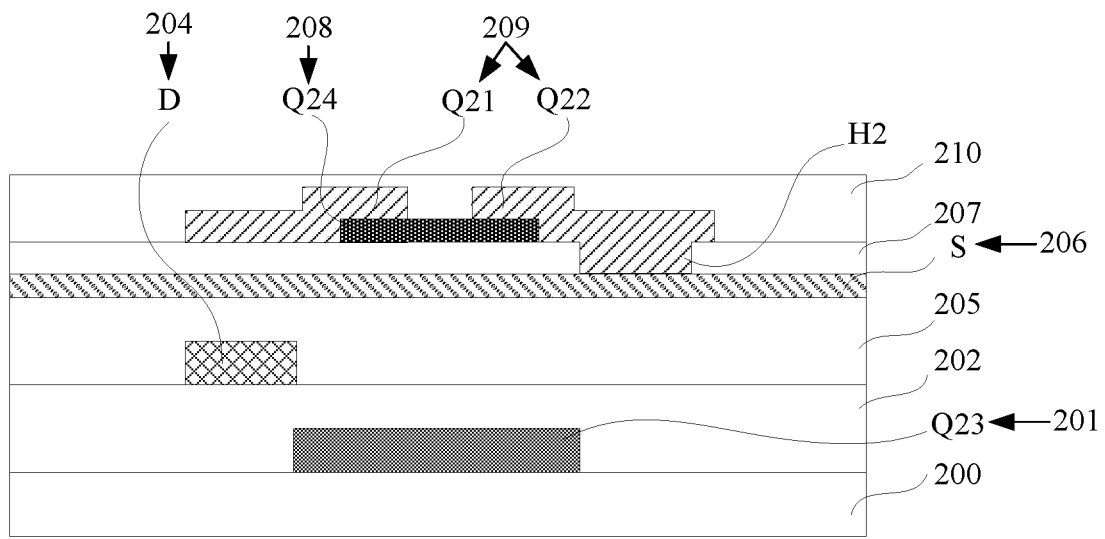
FIG. 6 is a schematic diagram of a section structure of an array substrate along a line b-b in FIG. 5 according to an embodiment of the present disclosure.

FIG. 6 is a schematic diagram of a section structure of an array substrate along a line b-b in FIG. 5 according to an embodiment of the present disclosure, and is used to show a section structure at the second thin film transistor Q2.

As shown in FIG. 6, the control electrode Q23 of the second thin film transistor Q2 is disposed at the first conductive pattern layer 201. The data line D is disposed at the second conductive pattern layer 204. An active layer Q24 of the second thin film transistor Q2 is disposed at the second semiconductor pattern layer 208. The first electrode Q21 and the second electrode Q22 of the second thin film transistor Q2 are disposed at the third conductive pattern layer 209.

With reference to FIG. 5 and FIG. 6, the second electrode Q22 of the second thin film transistor Q2 is connected to the touch electrode S through a second via H2. The second via H2 is disposed in the second insulating layer 207.

Figure 7:
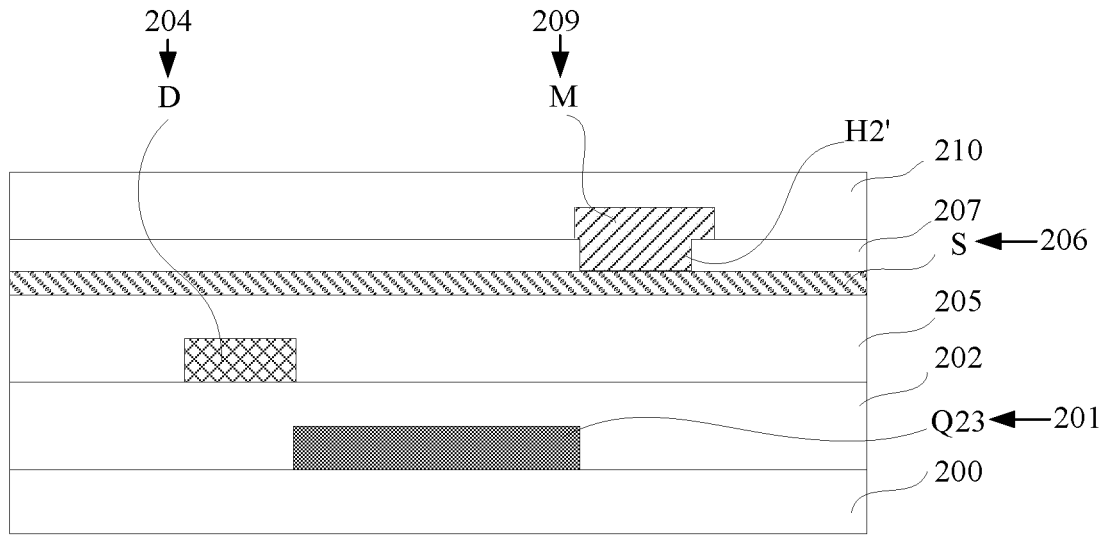
FIG. 7 is a schematic diagram of another section structure of an array substrate according to an embodiment of the present disclosure.

Alternatively, in other implementations, when the touch line and the touch electrode are disposed at different layers, the touch line may be connected to the touch electrode through a via, and a touch signal is input into the corresponding touch electrode by controlling a sequence of touch signals that are input into touch lines. For example, as shown in FIG. 7, the touch line M is connected to the touch electrode S through a via H2'. It should be noted that, when the touch line M is connected to the touch electrode S through the via H2', a layer dedicatedly used for forming a structure of the second thin film transistor Q2 such as the second semiconductor pattern layer 208 may be removed from the array substrate.

Alternatively, in other implementations of the present disclosure, the touch line and the touch electrode may be disposed at a same layer. In this case, the touch line and the touch electrode may be directly connected.

In this embodiment of the present disclosure, the plurality of touch electrodes S are disposed in an array. For example, each of the touch electrodes S may be rectangular. For example, it may be square with both a length and width of 4 mm. Each touch electrode may cover a plurality of subpixel regions. A quantity of subpixel regions corresponding to a single touch electrode may be determined by a resolution of a display apparatus. For a display apparatus of a fixed size, a higher resolution indicates a smaller area of each pixel region and a larger quantity of subpixel regions corresponding to one touch electrode. In contrast, a lower resolution indicates a larger area of each pixel region and a smaller quantity of subpixel regions corresponding to one touch electrode. In practical applications, both a shape and size of the touch electrode may be set based on an actual requirement.

Optionally, each of the touch electrodes is provided with at least two signal input points on the touch electrode, and the signal input points on each of the touch electrodes include at least one of a point electrically connected to the data line and a point electrically connected to the touch line. Each of the touch electrodes receives a touch signal by the at least two signal input points, which helps to improve uniformity of voltages on the touch electrodes.

For example, in the embodiment shown in FIG. 2, each of the touch electrodes S includes two points (respectively corresponding to two first vias H1) electrically connected to the data line D and two points (respectively corresponding to two second vias H2) electrically connected to the touch line M. The two points electrically connected to the data line D are disposed at an interval along an extension direction of the first control line C1, and the two points electrically connected to the touch line M are disposed at an interval along an extension direction of the second control line C2.

It should be noted that a quantity and locations of signal input points on the touch electrode may be set based on an actual requirement. In this embodiment of the present disclosure, a quantity and locations of signal input points on each touch electrode are the same.

Referring to FIG. 2 again, the array substrate further includes a plurality of gate lines SG. The plurality of data lines D extend along a first direction, the plurality of gate lines SG extend along a second direction, and the first direction intersects with the second direction, for example, the first direction is perpendicular to the second direction.

In the embodiment shown in FIG. 2, the gate line SG has a same extension direction as the first control line C1. In other words, the first control line C1 is parallel with the gate line SG. For a display apparatus, usually, in the extension direction of the gate line, a quantity of subpixel regions is relatively large, space between adjacent subpixels is relatively tight. That the first control line C1 extends along the extension direction of the gate line SG can prevent the space between the adjacent subpixels in the extension direction of the gate line from being occupied, which facilitates wiring.

Optionally, the first control line C1 and the gate line SG are disposed at a same layer. Because the control line and the gate line are disposed at the same layer, the control line and the gate line may be manufactured by one patterning process, thereby simplifying a manufacturing process.

Optionally, in this embodiment of the present disclosure, the second control line C2 has a same extension direction as the gate line SG. To further simplify a manufacturing process, the second control line C2 and the first control line C1 may also be disposed at the same layer.

The plurality of gate lines SG and the plurality of data lines D define a plurality of subpixel regions, and each of the subpixel regions includes one switching thin film transistor Q3 and one pixel electrode P. Referring to FIG. 3 and FIG. 5, in each of the subpixel regions, a first electrode Q31 of the switching thin film transistor Q3 is electrically connected to the data line D, a second electrode Q32 of the switching thin film transistor Q3 is electrically connected to the pixel electrode P, and a control electrode Q33 of the switching thin film transistor Q3 is electrically connected to the gate line SG.

The first electrode Q31 of the switching thin film transistor Q3 may be one of a source and a drain, the second electrode Q32 of the switching thin film transistor Q3 is the other one of the source and the drain, and the control electrode Q33 of the switching thin film transistor Q3 is a gate.

Figure 8:
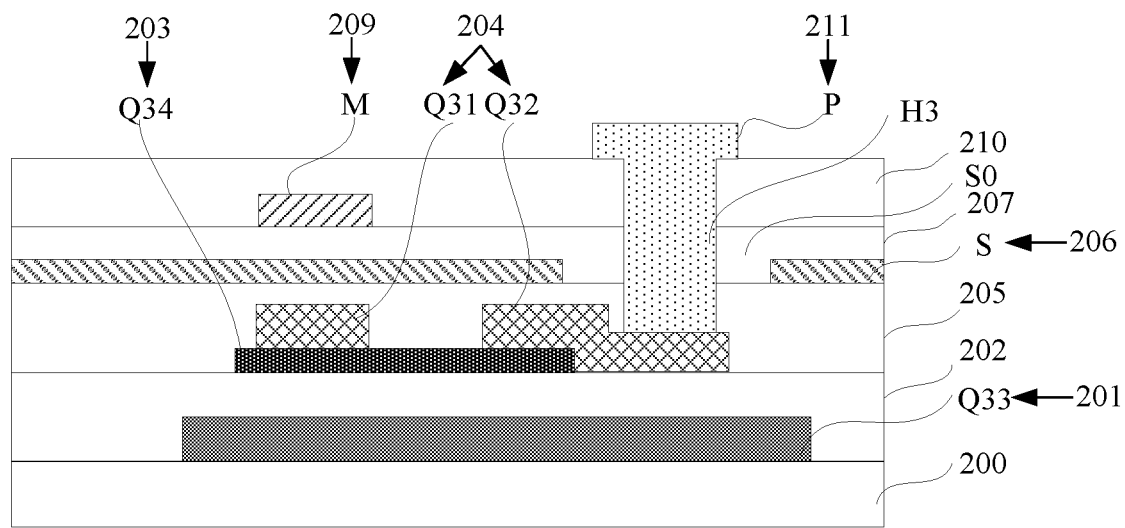
FIG. 8 is a schematic diagram of a section structure of an array substrate along a line c-c in FIG. 3 according to an embodiment of the present disclosure.

FIG. 8 is a schematic diagram of a section structure of an array substrate along a line c-c in FIG. 3 according to an embodiment of the present disclosure, and is used to show a section structure at the switching thin film transistor Q3.

As shown in FIG. 8, the control electrode Q33 of the switching thin film transistor Q3 is disposed at the first conductive pattern layer 201. An active layer Q34 of the switching thin film transistor Q3 is disposed at the first semiconductor pattern layer 203. The first electrode Q31 and the second electrode Q32 of the switching thin film transistor Q3 are disposed at the second conductive pattern layer 204. The pixel electrode P is disposed at the first electrode layer 211 (which may also be referred to as a pixel electrode layer).

In a direction distal from the base substrate 200, the touch electrode S and the pixel electrode P are sequentially disposed, in other words, the touch electrode layer 206 is disposed between the pixel electrode layer 211 and the base substrate 200. However, the switching thin film transistor Q3 is disposed between the touch electrode S and the pixel electrode P. Because the second electrode Q32 of the switching thin film transistor Q3 needs to be connected to the pixel electrode P, the touch electrode S is provided with a plurality of openings S0, the openings S0 are disposed in a one-to-one correspondence with the subpixel regions, the pixel electrode P in each of the subpixel regions is connected to the switching thin film transistor Q3 through a third via H3, and each third via H3 is provided in an opening S0 of a corresponding subpixel region. As shown in FIG. 8, the third via H3 passes through the first insulating layer 205 and the second insulating layer 207.

Figure 9:
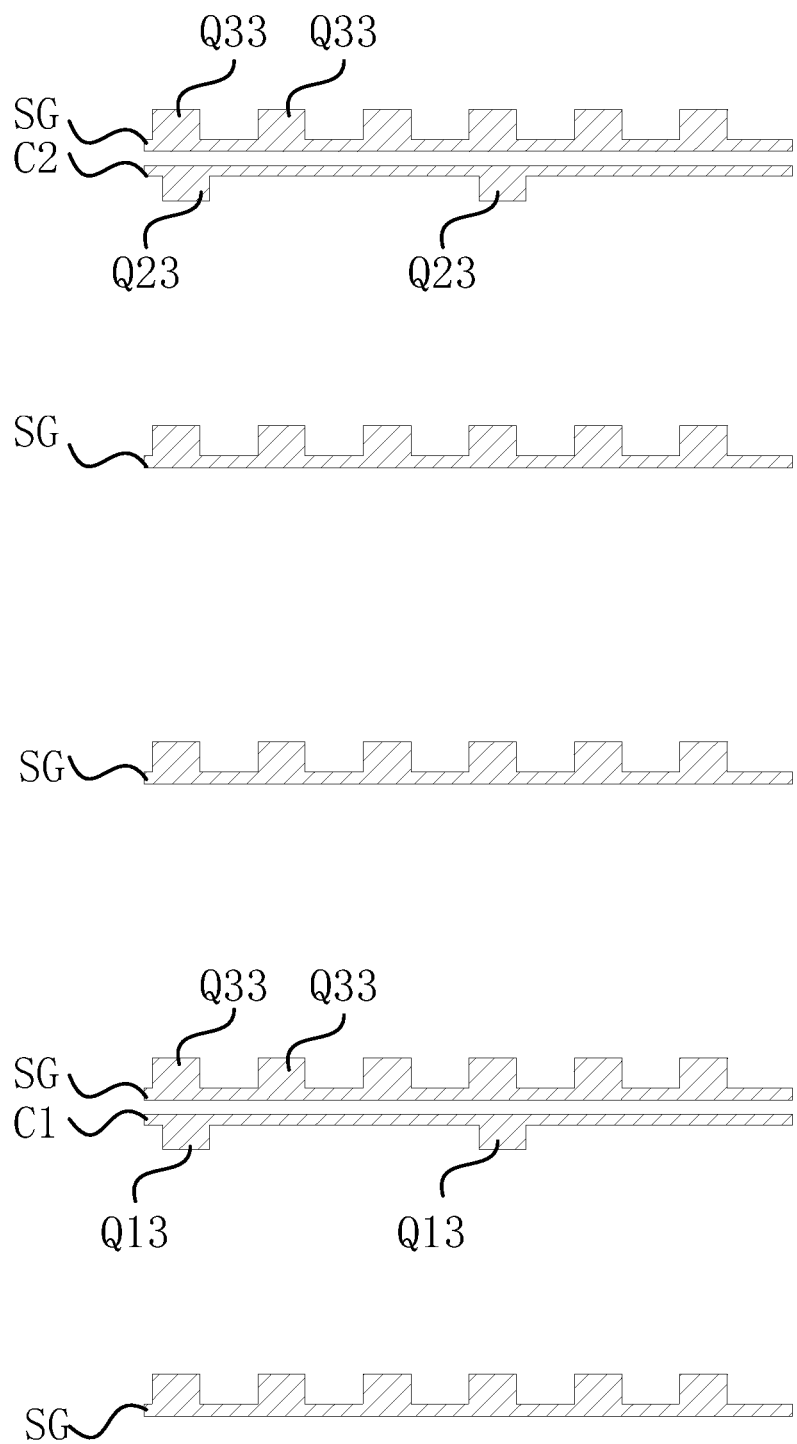
FIG. 9 is a schematic diagram of a first conductive pattern layer of an array substrate according to an embodiment of the present disclosure.

FIG. 9 is a schematic structural diagram of a first conductive pattern layer according to an embodiment of the present disclosure. As shown in FIG. 9, the first conductive pattern layer includes the gate lines SG, the first control line C1, the second control line C2, the control electrodes Q13 of the first thin film transistor Q1, the control electrodes Q23 of the second thin film transistor Q2, and the control electrodes Q33 of the switching thin film transistor Q3. The gate insulating layer 201 covers the first conductive pattern layer.

Figure 10:
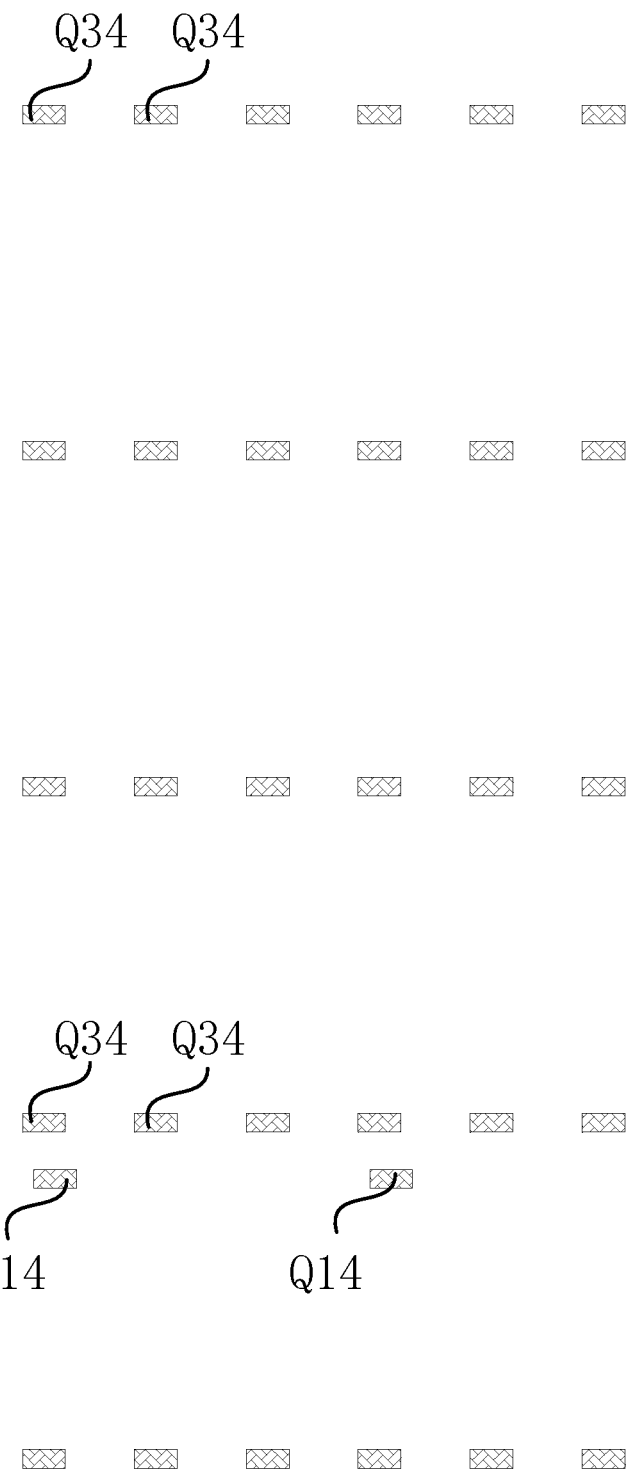
FIG. 10 is a schematic diagram of a first semiconductor pattern layer of an array substrate according to an embodiment of the present disclosure.

FIG. 10 is a schematic structural diagram of a first semiconductor pattern layer according to an embodiment of the present disclosure. As shown in FIG. 10, the first semiconductor pattern layer includes active layers Q14 of a first thin film transistor Q1 and active layers Q34 of a switching thin film transistors Q3.

Figure 11:
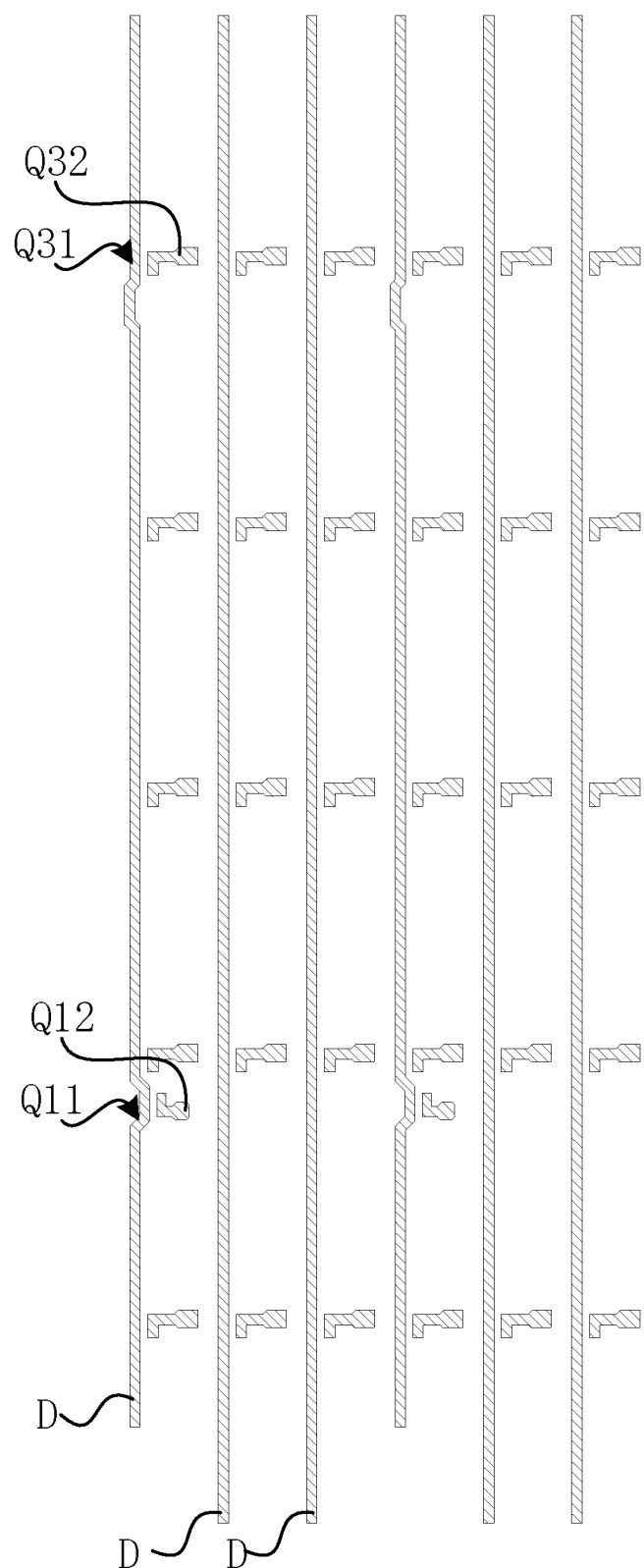
FIG. 11 is a schematic diagram of a second conductive pattern layer of an array substrate according to an embodiment of the present disclosure.

FIG. 11 is a schematic structural diagram of a second conductive pattern layer according to an embodiment of the present disclosure. As shown in FIG. 11, the second conductive pattern layer includes data lines D, first electrodes Q11 and second electrodes Q12 of first thin film transistors Q1, and first electrodes Q31 and second electrodes Q32 of switching thin film transistors Q3.

The first insulating layer 202 covers the second conductive pattern layer. The touch electrode layer 203 includes a plurality of touch electrodes S disposed in a array. The second insulating layer 204 covers the touch electrode layer 203. The second semiconductor pattern layer includes an active layer Q24 of a second thin film transistor Q2.

Figure 12:
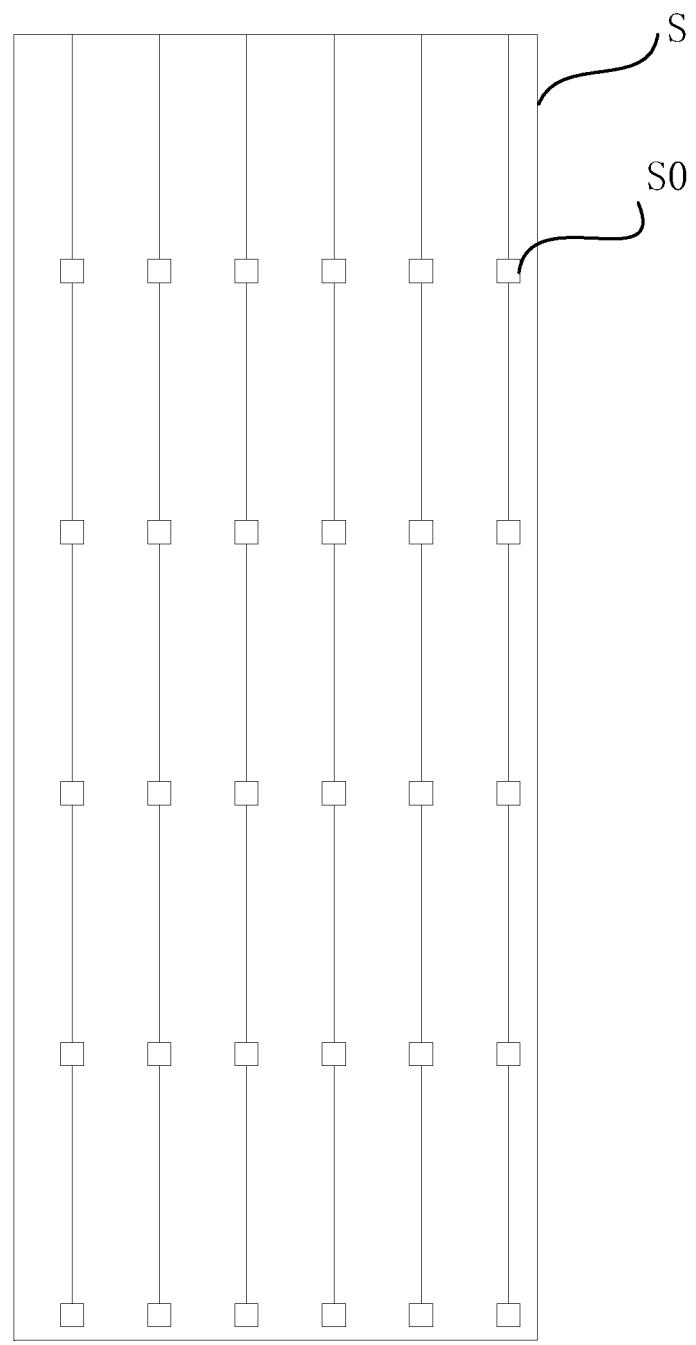
FIG. 12 is a schematic diagram of a touch electrode of an array substrate according to an embodiment of the present disclosure.

FIG. 12 is a schematic structural diagram of a touch electrode layer according to an embodiment of the present disclosure. As shown in FIG. 12, a touch electrode S is provided with a plurality of openings S0. Each of the openings S0 corresponds to one subpixel region.

Figure 13:
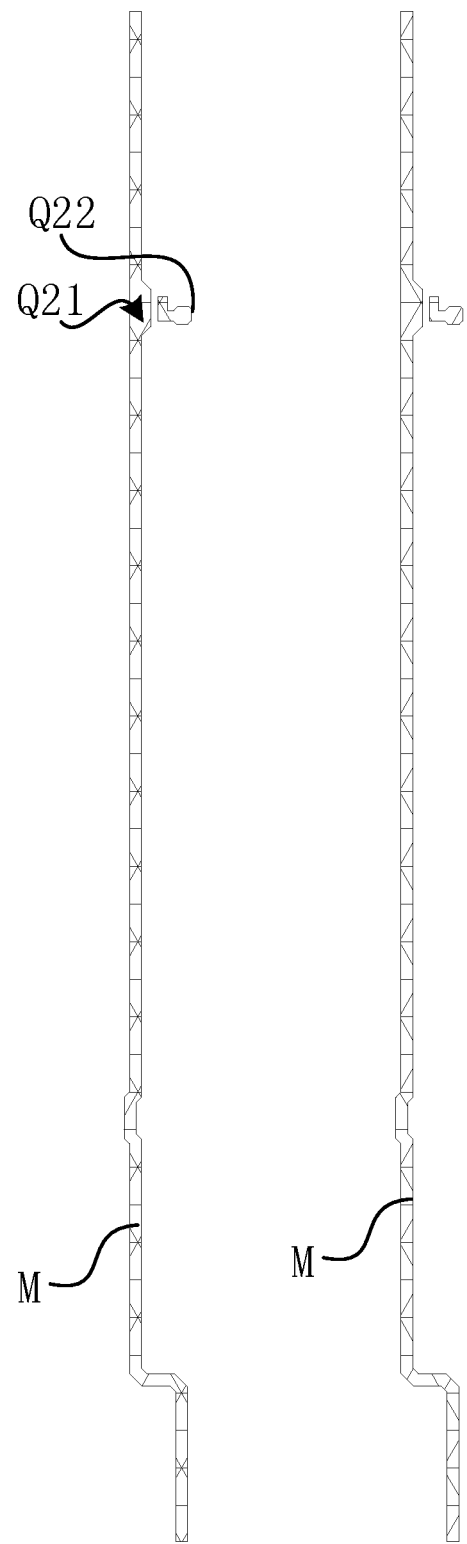
FIG. 13 is a schematic diagram of a third conductive pattern layer of an array substrate according to an embodiment of the present disclosure.

FIG. 13 is a schematic structural diagram of a third conductive pattern layer according to an embodiment of the present disclosure. As shown in FIG. 13, the third conductive pattern layer includes touch lines M, and first electrodes Q21 and second electrodes Q22 of second thin film transistors Q2. The third insulating layer 205 covers the third conductive pattern layer.

Alternatively, in other embodiments, an order of layers may be adjusted. For example, in a direction distal from a base substrate, a pixel electrode and a touch electrode are sequentially disposed, in other words, a pixel electrode layer is disposed is disposed between a layer at which the touch electrode is disposed and the base substrate. Correspondingly, a location of a via needs to be adjusted to implement an electrical connection relationship shown in FIG. 2.

For example, in this embodiment of the present disclosure, the base substrate is a transparent substrate, and may be made of a material such as glass or plastic. The gate line, data line, and control line are all made of a conductor, such as a metal material. The metal material may be a monometallic material, such as Al, Cu, or Mu, or may be an alloy material, such as an alloy of at least two of Al, Cu, and Mu. Materials used for the gate line, the data line, and the control line may be the same or different. The touch electrode is made of a transparent conductive material, such as ITO or IZO, to avoid affecting a display function of a display apparatus. The pixel electrode is also made of a transparent conductive material, such as ITO or IZO. The active layer may be made of InGaZnO, InGaO, ITZO, AlZnO, or other material. The gate insulating layer, the first insulating layer, the second insulating layer, and the third insulating layer may all be made of silicon nitride, silicon dioxide, or other material.

It should be noted that, in the embodiments shown in FIG. 2 to FIG. 13, a thin film transistor of a bottom-gate structure is used as an example for description. In other embodiments, the thin film transistor may also use a top-gate structure or a double-gate structure. This is not limited in the present disclosure. In other words, in other embodiments, the hierarchical relationships in FIG. 4 and FIG. 6 to FIG. 8 can be changed, a new layer can be added, and relative positions between layers can be adjusted.

Optionally, in this embodiment of the present disclosure, the touch line M and the data line D are disposed at different layers, and a projection of the touch line M on the base substrate falls within a projection of the corresponding data line D on the base substrate, or a projection of the data line D on the base substrate falls within a projection of the corresponding touch line M on the base substrate.

For example, the projection of the data line D on the base substrate and the projection of the corresponding touch line M on the base substrate may completely coincide. Such an arrangement can further reduce a pixel area occupied by the data line and the touch line, and increase an aperture ratio, thereby improving overall transmittance of products.

In other possible implementation of the embodiments of the present disclosure, when the data line is indirectly connected to the touch electrode by the first switching device and the touch line, the first switching device is correspondingly connected to one touch line and one data line. For example, the first switching device includes a third thin film transistor, the third thin film transistor is correspondingly connected to one data line and one touch line, and each touch line is connected to one data line by one third thin film transistor. A control electrode of the third thin film transistor is connected to a control line, and the control line is configured to provide a control signal to control the third thin film transistor to be turned on or turned off, and thus to control the data line and the touch line to be turned on or turned off. When the touch line is connected to the touch electrode, controlling the data line and the touch line to be turned on or turned off can control an electrical connection between the data line and the touch electrode to be turned on or turned off.

A first electrode of the third thin film transistor may be one of a source and a drain, a second electrode of the third thin film transistor is the other one of the source and the drain, and a control electrode of the third thin film transistor is a gate.

At a display stage, the third thin film transistor is turned off, the data line provides a data signal, and the touch line provides a common voltage signal to the touch electrode. At a touch stage, the third thin film transistor is turned on, the data line is electrically connected to the touch line, and then a touch signal is provided to the touch electrode by both the data line and the touch line.

It should be noted that, the structure of the array substrate in this embodiment is similar to the structure of the array substrate shown in FIG. 2. An only difference is that the first thin film transistor in FIG. 2 is removed, and the third thin film transistor is added between the touch line and the data line. The third thin film transistor can be added at, for example, A in FIG. 2. Other structure of the array substrate in this embodiment can be referenced to related descriptions in FIG. 2, and is not described herein again.

FIG. 14 is a schematic diagram of a section structure of an array substrate at a third thin film transistor according to an embodiment of the present disclosure. As shown in FIG. 14, the array substrate includes a base substrate 200, and a first conductive pattern layer 201, a gate insulating layer 202, a first semiconductor pattern layer 203, a second conductive pattern layer 204, a first insulating layer 205, a touch electrode layer 206, a second insulating layer 207, a second semiconductor pattern layer 208 (referring to FIG. 6), a third conductive pattern layer 209, a third insulating layer 210, and a first electrode layer 211 (referring to FIG. 8) that are sequentially disposed along a direction distal from the base substrate 200.

A control electrode Q43 of a third thin film transistor Q4 is disposed at the first conductive pattern layer 201. An active layer Q44 of the third thin film transistor Q4 is disposed at the first semiconductor pattern layer 203. A first electrode Q41 and a second electrode Q42 of the third thin film transistor Q4 are disposed at the second conductive pattern layer 204. A touch electrode S is disposed at the touch electrode layer 206. A touch line M is disposed at the third conductive pattern layer 209.

The second electrode Q42 of the third thin film transistor Q4 is connected to the touch line M through a fourth via H4. The fourth via H4 is disposed in the first insulating layer 205 and the second insulating layer 207. To facilitate forming of the fourth via H4, the touch electrode S is provided with a corresponding opening S1, and the fourth via H4 passes through the opening S1.

In the embodiment shown in FIG. 14, except that the first thin film transistor in the embodiment shown in FIG. 2 is replaced with the third thin film transistor, other structures are the same as the embodiment shown in FIG. 2. In other words, the first conductive pattern layer 201 includes the gate lines SG, the first control line C1, the second control line C2, the control electrode Q43 of the third thin film transistor Q4, the control electrode Q23 of the second thin film transistor Q2, and the control electrode Q33 of the switching thin film transistor Q3. The gate insulating layer 202 covers the first conductive pattern layer 201. The first semiconductor pattern layer 203 includes the active layer Q44 of the third thin film transistor Q4 and the active layer Q34 of the switching thin film transistor Q3. The second conductive pattern layer 204 includes the data line D, the first electrode Q41 and the second electrode Q42 of the third thin film transistor Q4, and the first electrode Q31 and the second electrode Q32 of the switching thin film transistor Q3. The first insulating layer 205 covers the second conductive pattern layer 204. The touch electrode layer 206 includes a plurality of touch electrodes S disposed in an array. The second insulating layer 207 covers the touch electrode layer 206. The second semiconductor pattern layer 208 includes the active layer Q24 of the second thin film transistor Q2. The third conductive pattern layer 209 includes the touch line M, and the first electrode Q21 and the second electrode Q22 of the second thin film transistor Q2. The third insulating layer 210 covers the third conductive pattern layer 209. The first electrode layer 211 includes a plurality of pixel electrodes P, and each of the pixel electrodes P is disposed in one subpixel region.

It should be noted that, in all the embodiments of the present disclosure, that a first switching device and a second switching device are both thin film transistors is used as an example for description. In other embodiments, the first switching device and the second switching device may be further field effect transistors or the like, provided that a switching action can be implemented under control of a control signal.

An embodiment of the present disclosure further provides a touch display apparatus. The touch display apparatus includes any one of the foregoing array substrates.

For example, the touch display apparatus may be any product or component having a display function such as a mobile phone, a tablet computer, a television, a notebook computer, a digital photo frame, or a navigator.

An embodiment of the present disclosure further provides a method for driving a touch display apparatus, applicable to driving the foregoing touch display apparatus. As shown in FIG. 15, the driving method includes the following steps.

In step 1501, at a display stage, a first switching device is controlled to turn off an electrical connection between a corresponding data line and a touch electrode, and a data signal is provided by the data line.

For a liquid crystal display apparatus, the step 1501 includes: at the display stage, a data signal is provided for a pixel electrode by the data line. For an OLED display apparatus, the step 1501 includes: at the display stage, a data signal is provided for an electrode (a cathode or an anode) of the OLED by the data line.

Optionally, the step 1501 may further include: at the display stage, a common voltage signal is provided for the touch electrode by a touch line. Therefore, the touch electrode may be multiplexed as a common electrode to simplify a structure of the display apparatus.

In step 1502, at a touch stage, the first switching device is controlled to turn on an electrical connection between the corresponding data line and the touch electrode, and a touch signal is provided for the touch electrode by both the data line and the touch line.

For example, the common voltage signal may be a level signal, and the touch signal may be a high-frequency pulse signal.

In this embodiment of the present disclosure, the display stage and the touch stage alternate periodically. For example, within a display time of a frame of image, a previous period is the display stage, and a later period is the touch stage.

Figure 16:
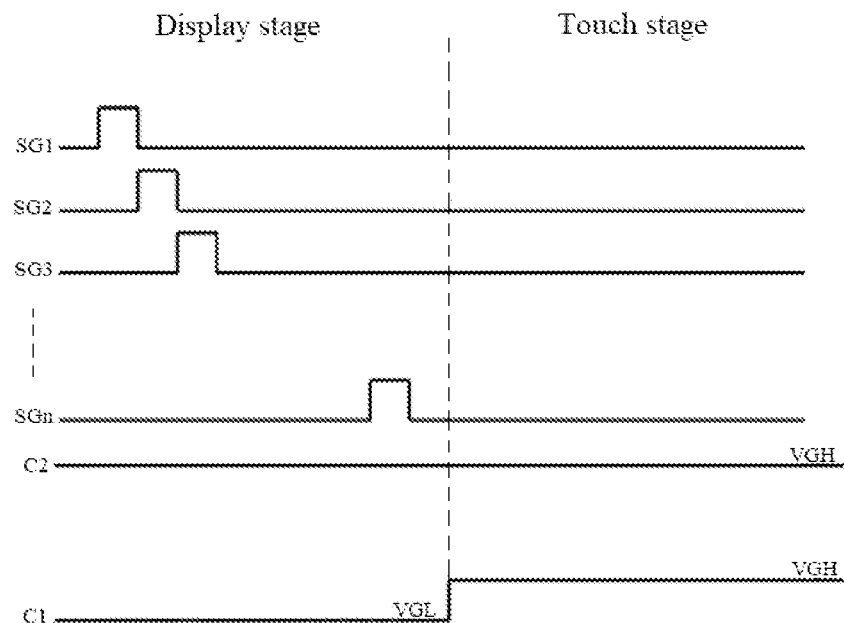
FIG. 16 is a sequence schematic diagram of a touch display apparatus according to an embodiment of the present disclosure.

Optionally, for the embodiment shown in FIG. 2, the touch display apparatus may be driven by a sequence signal in FIG. 16.

As shown in FIG. 16, at the display stage, scanning signals are sequentially input by gate lines SG1 to SGn for scanning line by line; a control signal on a second control line C2 is a high-level VGH, a second thin film transistor is turned on, the touch line is electrically connected to the corresponding touch electrode, and a common voltage signal is provided to the touch electrode by the touch line; a control signal on a first control line C1 is a low-level VGL, so that a first thin film transistor is turned off, and an electrical connection between the data line and the touch electrode is turned off.

At the touch stage, scanning signals on the gate lines SG1 to SGn are all at a low level, and the switching thin film transistor is turned off; a control signal on the second control line C2 is the high-level VGH, the second thin film transistor is turned on, the touch line is electrically connected to the corresponding touch electrode, and a touch signal is provided to the touch electrode by the touch line; a control signal on the first control line C1 turns into a high-level VGL, such that the first thin film transistor is turned on, an electrical connection between the data line and the touch electrode is turned on by the first thin film transistor and the control line, and a touch signal is provided for the touch electrode by both the data line and the touch line.

Figure 17:
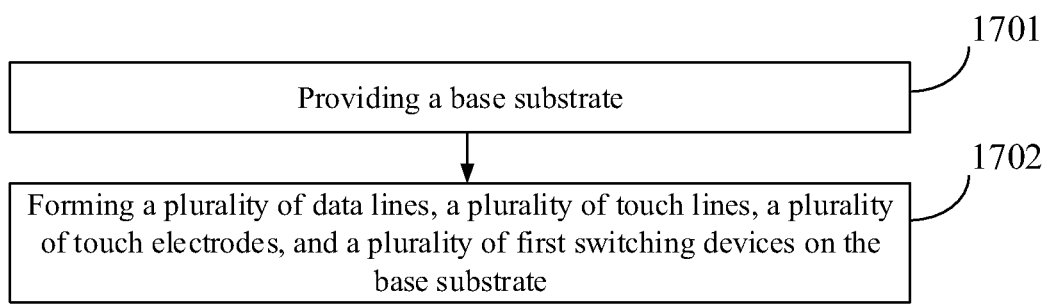
FIG. 17 is a flowchart of a method for manufacturing an array substrate according to an embodiment of the present disclosure.

An embodiment of the present disclosure further provides a method for manufacturing an array substrate. FIG. 17 is a flowchart of a method for manufacturing an array substrate according to an embodiment of the present disclosure. As shown in FIG. 17, the manufacturing method includes the following steps.

In step 1701, a base substrate is provided.

In step 1702, a plurality of data lines, a plurality of touch lines, a plurality of touch electrodes, and a plurality of first switching devices are formed on the base substrate.

Each of the touch electrodes is electrically connected to at least one of the touch lines, each of the first switching devices is electrically connected to one of the data lines and one of the touch electrodes separately, and each of the first switching devices is configured to selectively turn on or turn off the data line and the touch electrode.

Figure 18:
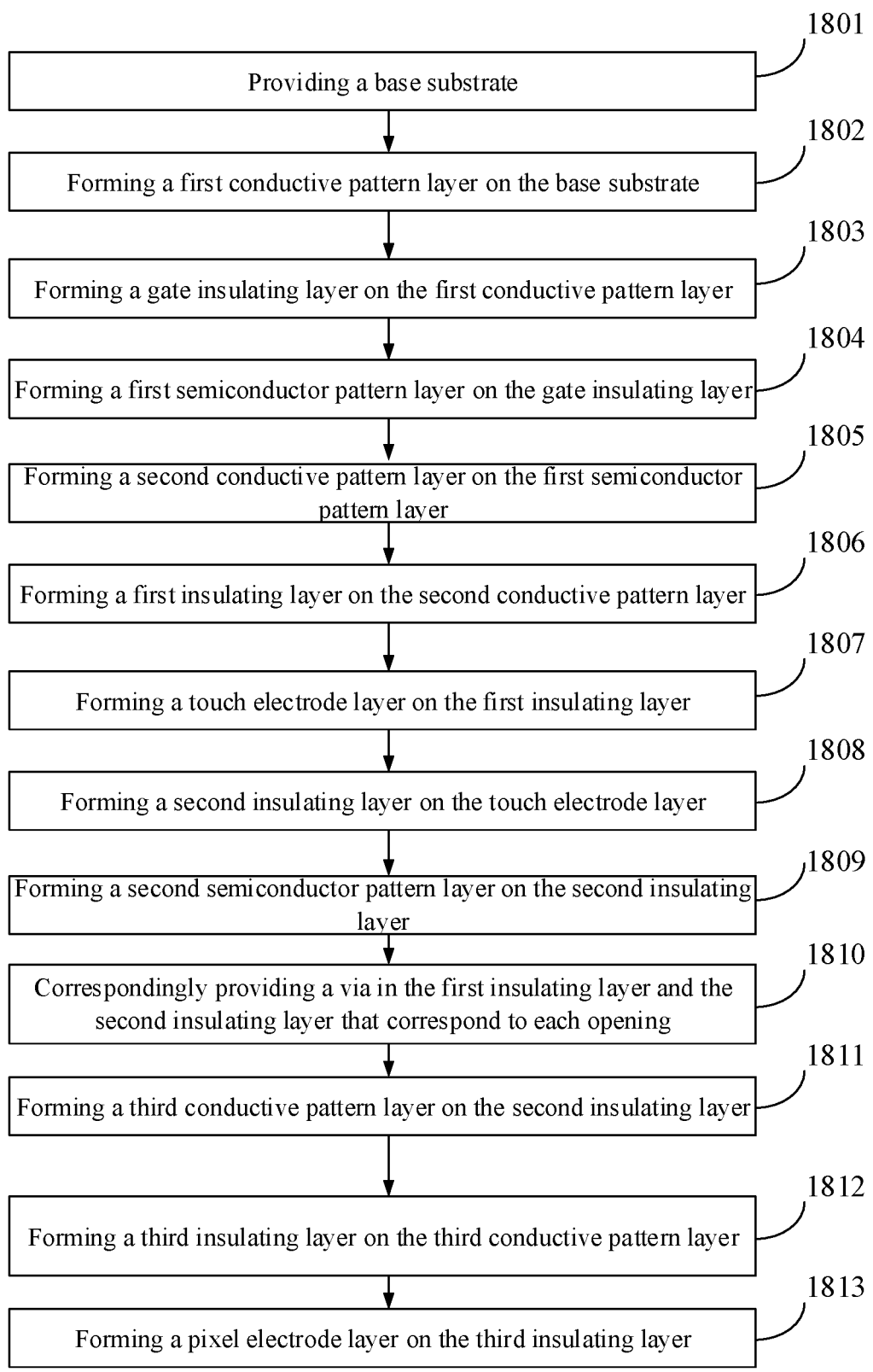
FIG. 18 is a flowchart of another method for manufacturing an array substrate according to an embodiment of the present disclosure.

FIG. 18 is a flowchart of another method for manufacturing an array substrate according to an embodiment of the present disclosure. The method is used to manufacture the array substrate shown in FIG. 2. As shown in FIG. 18, the method includes the following steps.

In step 1801, a base substrate is provided.

The base substrate may be a transparent substrate, and may be made of a material such as glass or plastic.

In step 1802, a first conductive pattern layer is formed on the base substrate.

FIG. 9 is a schematic diagram of the first conductive pattern layer. As shown in FIG. 9, the first conductive pattern layer may include the gate lines SG, the first control line C1, the second control line C2, the control electrodes Q13 of the first thin film transistor Q1, the control electrodes Q23 of the second thin film transistor Q2, and the control electrodes Q33 of the switching thin film transistor Q3.

For example, a first conductive material layer may be formed on the base substrate, and then processed by a patterning process to obtain the first conductive pattern layer. The first conductive material layer may be a metal thin film, and the first conductive material layer may be formed through sputtering or the like.

In step 1803, a gate insulating layer is formed on the first conductive pattern layer.

The gate insulating layer covers the first conductive pattern layer. For example, the gate insulating layer may be formed through vapor deposition. The gate insulating layer may be made of an insulating material, such as silicon nitride or silicon dioxide.

In step 1804, a first semiconductor pattern layer is formed on the gate insulating layer.

In the step 1804, a semiconductor material thin film may be first formed on the gate insulating layer. For example, the semiconductor material thin film may be formed on the gate insulating layer through deposition. The semiconductor material thin film may be at least one of InGaZnO, InGaO, ITZO, and AlZnO. Then the semiconductor material thin film is patterned by a patterning process to obtain the first semiconductor pattern layer.

FIG. 10 is a schematic diagram of the first semiconductor pattern layer. As shown in FIG. 10, the first semiconductor pattern layer includes the active layers Q14 of the first thin film transistor Q1 and the active layers Q34 of the switching thin film transistors Q3.

In step 1805, a second conductive pattern layer is formed on the first semiconductor pattern layer.

In the step 1805, a second conductive material layer is formed on the base substrate on which the first semiconductor pattern layer is formed, and then the second conductive material layer is processed by the patterning process to obtain the second conductive pattern layer. The second conductive material layer may be a metal thin film, and the second conductive material layer may be formed through sputtering or the like.

For example, FIG. 11 is a schematic diagram of the second conductive pattern layer. As shown in FIG. 11, the second conductive pattern layer includes the data lines D, the first electrodes Q11 and the second electrodes Q12 of the first thin film transistors Q1, and the first electrodes Q31 and the second electrodes Q32 of the switching thin film transistors Q3.

In step 1806, a first insulating layer is formed on the second conductive pattern layer.

The first insulating layer covers the second conductive pattern layer. For example, the first insulating layer may be formed through vapor deposition. The first insulating layer may be made of an insulating material, such as silicon nitride or silicon dioxide.

Optionally, in this embodiment of the present disclosure, the method further includes: a first via is provided at a location corresponding to a second electrode of a second thin film transistor in the first insulating layer.

In step 1807, a touch electrode layer is formed on the first insulating layer.

The touch electrode layer includes a plurality of touch electrodes disposed in an array. FIG. 12 is a schematic diagram of the touch electrode. As shown in FIG. 12, the touch electrode S is provided with a plurality of openings S0.

For example, a transparent conductive material layer may be formed on the first insulating layer, and then processed by the patterning process to obtain the touch electrode layer. The transparent conductive material layer may be formed through deposition. The transparent conductive material layer may be an ITO layer, an IZO layer, or the like.

In step 1808, a second insulating layer is formed on the touch electrode layer.

A manner of forming the second insulating layer may be the same as the manner of forming the first insulating layer. Detailed description is omitted herein.

In step 1809, a second semiconductor pattern layer is formed on the second insulating layer.

A manner of forming the second semiconductor pattern layer may be the same as the manner of forming the first semiconductor pattern layer.

In this embodiment of the present disclosure, the second semiconductor pattern layer includes the active layer of the second thin film transistor.

In step 1810, a via is correspondingly provided in the first insulating layer and the second insulating layer that correspond to each opening.

The via in step 1810 is the foregoing third via.

In step 1811, a third conductive pattern layer is formed on the second insulating layer.

In the step 1811, the third conductive material layer is formed on the second insulating layer, and then the third conductive material layer is processed by the patterning process to obtain the third conductive pattern layer. The third conductive material layer may be a metal thin film, and the third conductive material layer may be formed through sputtering or the like.

For example, FIG. 13 is a schematic diagram of the third conductive pattern layer. As shown in FIG. 13, the third conductive pattern layer includes the touch lines M, and the first electrodes Q21 and the second electrodes Q22 of the second thin film transistors Q2.

In step 1812, a third insulating layer is formed on the third conductive pattern layer.

In the step 1812, a via (that is, the foregoing second via) is further provided in the third insulating layer. A manner of forming the third insulating layer is the same as the manner of forming the second insulating layer.

In step 1813, a pixel electrode layer is formed on the third insulating layer.

For example, a transparent conductive material layer may be formed on the third insulating layer, and then processed by the patterning process to obtain the pixel electrode layer. The transparent conductive material layer may be formed through deposition. The transparent conductive material layer may be an ITO layer, an IZO layer, or the like.

The pixel electrode layer includes a plurality of pixel electrodes, and each pixel electrode is connected to the second electrode of the corresponding second thin film transistor through the second via.

The descriptions above are only optional embodiments of the present disclosure, but are not intended to limit the present disclosure; and any modifications, equivalent substitutions, improvements and the like made within the spirit and principles of the present disclosure are all intended to be concluded in the protection scope of the present disclosure.

What is claimed is:

1. An array substrate, comprising: a plurality of data lines, a plurality of touch lines, a plurality of touch electrodes, a plurality of first switching devices, a plurality of gate lines, and a plurality of first control lines connected to the plurality of first switching devices, wherein each of the touch electrodes is electrically connected to at least one of the touch lines, each of the first switching devices is electrically connected to one of the data lines and one of the touch electrodes respectively, each of the first switching devices is configured to selectively turn on or turn off the data line and the touch electrode which are connected, the plurality of gate lines intersect with the plurality of data lines, the plurality of first control lines have a same extension direction as the plurality of gate lines, and each of the touch electrodes comprises two points electrically connected to the data line and two points electrically connected to the touch line, wherein the two points electrically connected to the data line are disposed at an interval along an extension direction of the first control line, and the two points electrically connected to the touch line are disposed at an interval along the extension direction of the first control line.

2. The array substrate according to claim 1, wherein the first switching device comprises a first thin film transistor, a first electrode of the first thin film transistor is electrically connected to the corresponding data line, and a second electrode of the first thin film transistor is electrically connected to the corresponding touch electrode.

3. The array substrate according to claim 1, wherein the first switching device comprises a second thin film transistor, a first electrode of the second thin film transistor is electrically connected to the corresponding data line, and a second electrode of the second thin film transistor is electrically connected to one of the touch lines that is connected to the touch electrode corresponding to the second electrode of the second thin film transistor.

4. The array substrate according to claim 1, further comprising: a plurality of second switching devices,
wherein each of the touch lines is electrically connected to the corresponding touch electrode by one of the second switching devices, and each of the second switching devices is configured to selectively turn on or turn off the touch line and the touch electrode which are connected.

5. The array substrate according to claim 4, wherein the second switching device comprises a third thin film transistor,
wherein a first electrode of the third thin film transistor is electrically connected to one of the touch lines, and a second electrode of the third thin film transistor is electrically connected to one of the touch electrodes.

6. The array substrate according to claim 4, further comprising a plurality of gate lines and a plurality of second control lines connected to the plurality of second switching devices,
wherein the plurality of gate lines intersect with the plurality of data lines, and the plurality of second control line have a same extension direction as the plurality of gate lines.

7. The array substrate according to claim 1, wherein the touch line and the touch electrode meet any one of following relationships:
the touch line and the touch electrode are disposed at different layers, and the touch line is connected to the corresponding touch electrode through a via; or
the touch line and the touch electrode are disposed at a same layer, and the touch line is directly connected to the corresponding touch electrode.

8. The array substrate according to claim 1, further comprising a plurality of gate lines,
wherein the plurality of gate lines and the plurality of data lines define a plurality of subpixel regions, and each subpixel region comprises one switching thin film transistor and one first electrode;
in each of the subpixel regions, a first electrode of the switching thin film transistor is electrically connected to the data line, a second electrode of the switching thin film transistor is electrically connected to the first electrode, and a control electrode of the switching thin film transistor is electrically connected to the gate line; and
the first electrode is at least one of following electrodes: a pixel electrode, and an electrode of an organic light emitting diode.

9. The array substrate according to claim 8, wherein the switching thin film transistor, the touch electrode, and the first electrode are sequentially disposed in a direction distal from the array substrate, an opening is provided on the touch electrode, and the second electrode of the switching thin film transistor is connected to the first electrode through a via in the opening.

10. The array substrate according to claim 1, wherein the first control line and the gate line are disposed at a same layer.

11. The array substrate according to claim 1, wherein the touch line and the data line are disposed at different layers, and a projection of the touch line on a base substrate and a projection of the data line on the base substrate meet either of the following relationships:
the projection of the touch line on the base substrate falls within the projection of the corresponding data line on the base substrate; and
the projection of the data line on the base substrate falls within the projection of the corresponding touch line on the base substrate.

12. The array substrate according to claim 1, wherein the plurality of touch electrodes are disposed in an array, and an orthographic projection of each of the touch electrodes on the array substrate covers a plurality of subpixel regions.

13. A method for driving an array substrate, applicable to driving the array substrate as defined in claim 1; wherein the driving method comprises:
at a display stage, controlling the first switching device to turn off an electrical connection between the data line and the touch electrode, and providing a data signal by the data line; and
at a touch stage, controlling the first switching device to turn on an electrical connection between the data line and the touch electrode, and providing a touch signal for the touch electrode by both the data line and the touch line.

14. The driving method according to claim 13, further comprising:
at the display stage, providing a common voltage signal for the touch electrode by the touch line.

15. A method for manufacturing an array substrate, the method is used for manufacturing the array substrate according to claim 1, and the method comprising:
providing a base substrate; and
forming a plurality of data lines, a plurality of touch lines, a plurality of touch electrodes, and a plurality of first switching devices on the array substrate, wherein each of the touch electrodes is electrically connected to at least one of the touch lines, each of the first switching devices is electrically connected to one of the data lines and one of the touch electrodes separately, and each of the first switching devices is configured to selectively turn on or turn off the data line and the touch electrode which are connected.

16. The array substrate according to claim 1, wherein one of the two points electrically connected to the data line and one of the two points electrically connected to the touch line are disposed at an interval along an extension direction of the data line, and the other of the two points electrically connected to the data line and the other of the two points electrically connected to the touch line are disposed at an interval along the extension direction of the data line.

17. An array substrate, comprising a base substrate, and a first conductive pattern layer, a gate insulating layer, a first semiconductor pattern layer, a second conductive pattern layer, a first insulating layer, a touch electrode layer, a second insulating layer, a third conductive pattern layer, a third insulating layer, and a first electrode layer that are sequentially disposed on the base substrate along a direction distal from the base substrate; wherein
- the first conductive pattern layer comprises a plurality of gate lines, a plurality of first control lines, control electrodes of a plurality of first thin film transistors, and control electrodes of a plurality of switching thin film transistors, the plurality of first control lines have a same extension direction as the plurality of gate lines, the control electrodes of the plurality of first thin film transistor is electrically connected to the first control line, and the control electrodes of the plurality of switching thin film transistors are electrically connected to the gate lines;
- the first semiconductor pattern layer comprises active layers of the plurality of first thin film transistors and active layers of the plurality of switching thin film transistors;
- the second conductive pattern layer comprises a plurality of data lines, first electrodes and second electrodes of the plurality of first thin film transistors, and first electrodes and second electrodes of the plurality of switching thin film transistors, the first electrode of the first thin film transistor and the first electrode of the switching thin film transistor are electrically connected to the corresponding data line respectively, and the plurality of gate lines intersect with the plurality of data lines;
- the touch electrode layer comprises a plurality of touch electrodes disposed in an array, and each of the touch electrodes is electrically connected to the second electrode of at least one of the first thin film transistors;
- the third conductive pattern layer comprises a plurality of touch lines, the plurality of touch lines have a same extension direction as the data line, and each of the touch electrodes is electrically connected to at least one of touch lines;
- the first electrode layer comprises a plurality of first electrodes, and the first electrode is at least one of following electrodes: a pixel electrode and an electrode of an organic light-emitting diode;
- the plurality of gate lines intersect with the plurality of data lines and define a plurality of subpixel regions, one of the switching thin film transistors and one of the first electrodes are provided in each of the subpixel regions, and the second electrode of each of the switching thin film transistors is electrically connected to the corresponding first electrode; and
- each of the touch electrodes comprises two points electrically connected to the data line and two points electrically connected to the touch line, wherein the two points electrically connected to the data line are disposed at an interval along an extension direction of the first control line, and the two points electrically connected to the touch line are disposed at an interval along the extension direction of the first control line.

18. The array substrate according to claim 17, wherein the first conductive pattern layer further comprises a plurality of second control lines and control electrodes of a plurality of second thin film transistors, the second control line has a same extension direction as that of the gate line, and the control electrode of the second thin film transistor is electrically connected to the corresponding second control line;
- the third conductive pattern layer further comprises first electrodes and second electrodes of the plurality of second thin film transistors, the first electrode of each of the second thin film transistors is electrically connected to the corresponding touch line, and the second electrode of each of the second thin film transistors is electrically connected to the corresponding touch electrode; and
- the array substrate further comprises a second semiconductor pattern layer, and the second semiconductor pattern layer comprises active layers of the plurality of second thin film transistors.

19. The array substrate according to claim 17, wherein one of the two points electrically connected to the data line and one of the two points electrically connected to the touch line are disposed at an interval along an extension direction of the data line, and the other of the two points electrically connected to the data line and the other of the two points electrically connected to the touch line are disposed at an interval along the extension direction of the data line.

20. A touch display apparatus, comprising an array substrate, wherein the array substrate comprises a plurality of data lines, a plurality of touch lines, a plurality of touch electrodes, a plurality of first switching devices, a plurality of gate lines, and a plurality of first control lines connected to the plurality of first switching devices,
- wherein each of the touch electrodes is electrically connected to at least one of the touch lines, each of the first switching devices is electrically connected to one of the data lines and one of the touch electrodes respectively, each of the first switching devices is configured to selectively turn on or turn off the data line and the touch electrode which are connected, the plurality of gate lines intersect with the plurality of data lines, the plurality of first control lines have a same extension direction as the plurality of gate lines, and each of the touch electrodes comprises two points electrically connected to the data line and two points electrically connected to the touch line, wherein the two points electrically connected to the data line are disposed at an interval along an extension direction of the first control line, and the two points electrically connected to the touch line are disposed at an interval along the extension direction of the first control line.

21. The touch display apparatus according to claim 20, wherein one of the two points electrically connected to the data line and one of the two points electrically connected to the touch line are disposed at an interval along an extension direction of the data line, and the other of the two points electrically connected to the data line and the other of the two points electrically connected to the touch line are disposed at an interval along the extension direction of the data line.

* * * * *